(12) United States Patent
Sonobe et al.

(10) Patent No.: US 7,906,365 B2
(45) Date of Patent: Mar. 15, 2011

(54) METHOD OF MANUFACTURING SOLAR CELL PANEL

(75) Inventors: Hiroshi Sonobe, Nagasaki-ken (JP); Akemi Takano, Nagasaki-ken (JP); Yoshikazu Nawata, Nagasaki-ken (JP); Kazumasa Uchihashi, Nagasaki-ken (JP); Kazuhiko Ogawa, Nagasaki-ken (JP); Tsukasa Yamane, Nagasaki-ken (JP); Nobuki Yamashita, Nagasaki-ken (JP)

(73) Assignee: Mitsubishi Heavy Industries, Ltd. (JP)

( * ) Notice: Subject to any disclaimer, the term of this patent is extended or adjusted under 35 U.S.C. 154(b) by 865 days.

(21) Appl. No.: 11/848,976

(22) Filed: Aug. 31, 2007

(65) Prior Publication Data

US 2008/0121613 A1  May 29, 2008

(30) Foreign Application Priority Data

Sep. 6, 2006  (JP) .................. 2006-241177

(51) Int. Cl.
*H01L 21/00* (2006.01)
*H01L 27/142* (2006.01)

(52) U.S. Cl. ............... 438/73; 136/249; 134/1.3

(58) Field of Classification Search .......... 438/73; 136/249; 134/1.3
See application file for complete search history.

(56) References Cited

U.S. PATENT DOCUMENTS

| | | | | |
|---|---|---|---|---|
| 4,084,985 A * | 4/1978 | Evans, Jr. | .............. | 136/251 |
| 4,152,824 A * | 5/1979 | Gonsiorawski | .............. | 438/98 |
| 4,227,942 A * | 10/1980 | Hall | .............. | 136/255 |
| 5,417,770 A * | 5/1995 | Saitoh et al. | .............. | 136/258 |
| 5,635,408 A * | 6/1997 | Sano et al. | .............. | 438/58 |
| 5,894,853 A * | 4/1999 | Fujisaki et al. | .............. | 134/26 |
| 6,156,967 A | 12/2000 | Ralph et al. | | |
| 6,307,146 B1 * | 10/2001 | Takeuchi et al. | .............. | 136/258 |
| 6,506,260 B1 * | 1/2003 | Hiraishi et al. | .............. | 134/15 |
| 6,683,244 B2 * | 1/2004 | Fujimori et al. | .............. | 136/263 |
| 6,911,593 B2 * | 6/2005 | Mazumder et al. | .............. | 136/251 |
| 2002/0066473 A1 * | 6/2002 | Levy et al. | .............. | 134/34 |
| 2002/0108649 A1 * | 8/2002 | Fujimori et al. | .............. | 136/263 |

(Continued)

FOREIGN PATENT DOCUMENTS

JP  3057599 B2  4/2000

(Continued)

OTHER PUBLICATIONS

El-Shoboskhy, M.S., et al. "Effect of dust with difference of photovoltaic cells," Published Dec. 1, 1993.

(Continued)

*Primary Examiner* — David Vu
*Assistant Examiner* — Earl N Taylor
(74) *Attorney, Agent, or Firm* — Kanesaka Berner & Partners, LLP

(57) ABSTRACT

A method of manufacturing a solar cell panel, includes steps (a) to (e). The step (a) is a step of forming a solar cell module by laminating solar cell films on a transparency substrate. The step (b) is a step of performing an inspection of electric power generation on the solar cell module. The step (c) is a step of forming a solar cell panel by executing a panel formation on the solar cell module. The step (d) is a step of cleaning a light incidence surface of the solar cell panel. The step (e) is a step of performing an inspection of electric power generation on the solar cell panel. The step (d) is executed immediately before the step (e).

8 Claims, 7 Drawing Sheets

U.S. PATENT DOCUMENTS

| | | | |
|---|---|---|---|
| 2005/0061360 A1* | 3/2005 | Horioka et al. | 136/244 |
| 2005/0072461 A1* | 4/2005 | Kuchinski et al. | 136/256 |
| 2005/0076945 A1 | 4/2005 | Tachibana et al. | |
| 2006/0076050 A1* | 4/2006 | Williams et al. | 136/263 |
| 2007/0068568 A1* | 3/2007 | Ogawa et al. | 136/251 |
| 2007/0169805 A1* | 7/2007 | Sasaki et al. | 136/256 |
| 2007/0289626 A1* | 12/2007 | Brabec et al. | 136/263 |
| 2008/0169203 A1* | 7/2008 | Yekutiely et al. | 205/637 |

FOREIGN PATENT DOCUMENTS

| | | |
|---|---|---|
| JP | 2001-007371 A | 1/2001 |
| JP | 2005-235916 A | 9/2005 |

OTHER PUBLICATIONS

European Search Report for Application No. 07115016.3-1528, Mailed Aug. 13, 2010.

\* cited by examiner

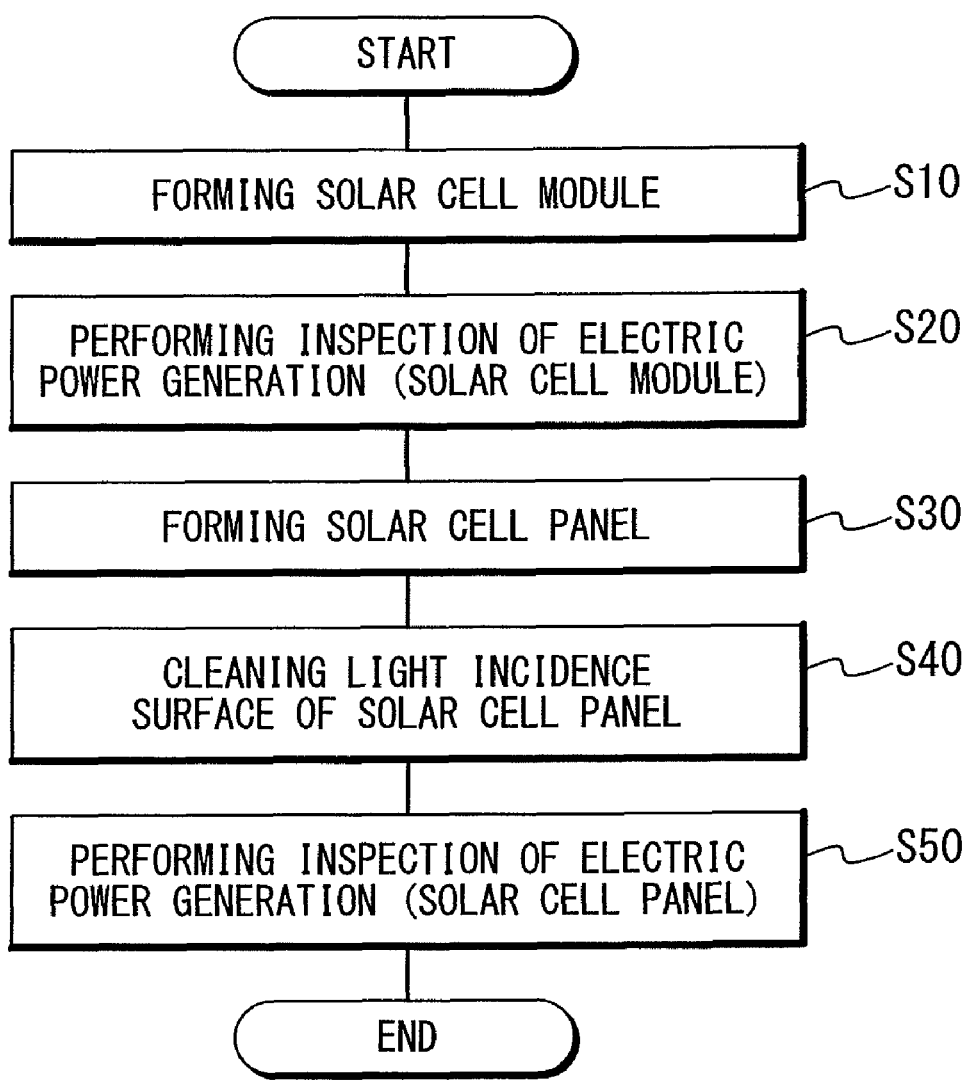

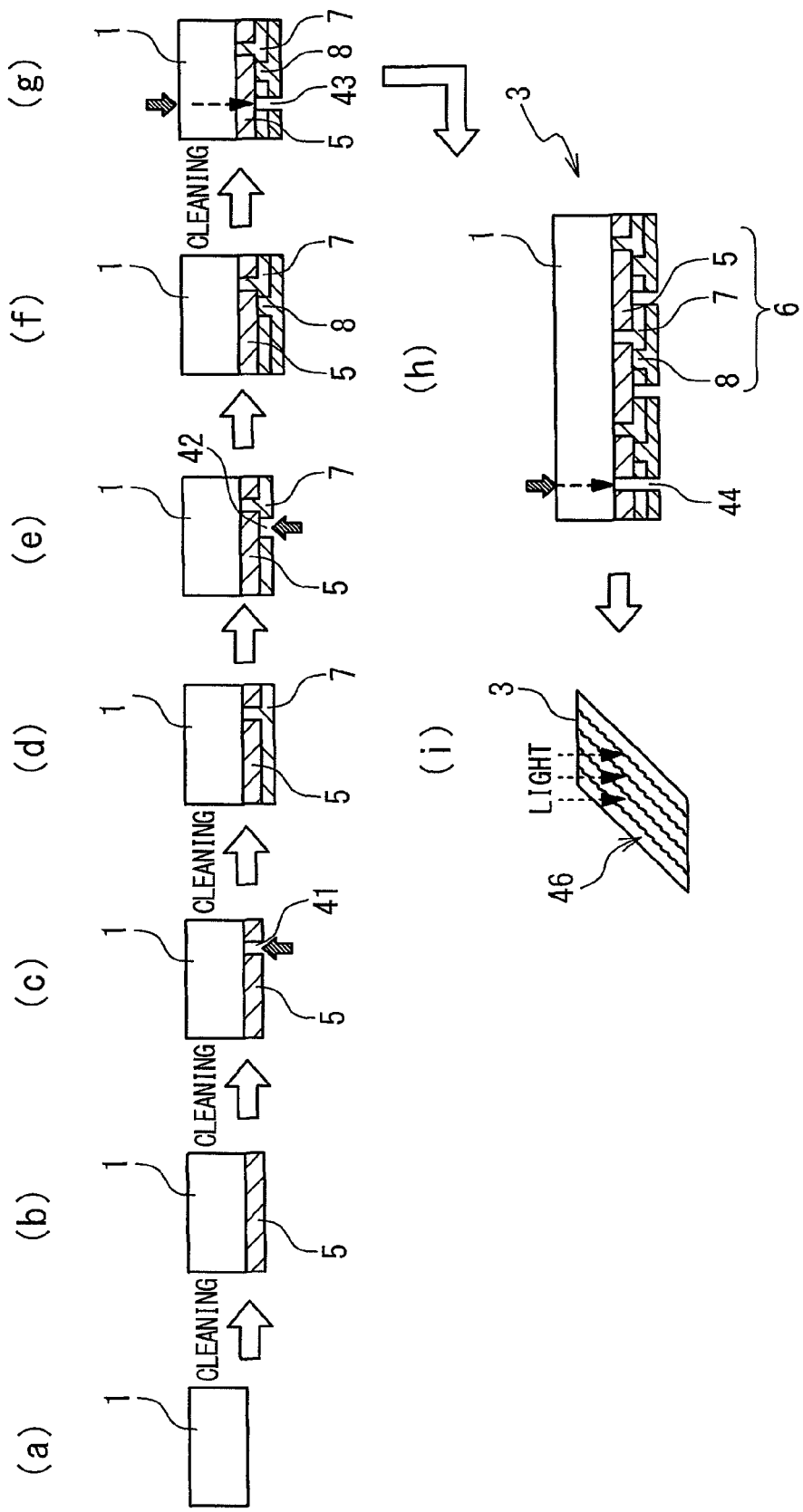

Fig. 6

| DIRT REMOVING METHOD FOR LIGHT INCIDENCE SURFACE | OUTPUT CHANGE | DISPERSION |
|---|---|---|
| EMBODIMENT 1 | -3.3% | 1.2% |
| EMBODIMENT 2 | -2.5% | 0.9% |
| EMBODIMENT 3 | -0.8% | 0.3% |
| COMPARATIVE EXAMPLE 1 | -5.1% | 2.0% |
| COMPARATIVE EXAMPLE 2 | -4.7% | 2.4% |

METHOD OF MANUFACTURING SOLAR CELL PANEL

RELATED APPLICATIONS

The present application is based on, and claims priority from, Japanese Application Number 2006-241177, filed Sep. 6, 2006, the disclosure of which is hereby incorporated by reference herein in its entirety.

BACKGROUND OF THE INVENTION

1. Field of the Invention

The present invention relates to a method of manufacturing a solar cell panel.

2. Description of Related Art

A method of manufacturing a solar cell panel is known, wherein the solar cell panel generates electric power by receiving sunlight. The method of manufacturing the solar cell panel includes: a process of forming a solar cell module; and a process of forming a panel using the solar cell module. In the process of forming the solar cell module, films used for solar cells are laminated on a transparency substrate and patterned by using laser etching or the like into a plurality of solar cells, which are integrated with series junctions. In the panel forming process, removal of the films located in a non-power-generating region, attachment of a cover sheet or the like, fitting of wires and a terminal box for drawing electric power, and the like are performed on the solar cell module to form a panel using the solar cell module. Moreover, in the panel forming process, the single substrate may be divided into a plurality of pieces, when necessary.

When the solar cell panel has adhesive substances or dirt (hereinafter may also be described as foreign substances) on a light incidence surface, light is interrupted by the foreign substances and a lower side of the foreign substances may become shady. Thus, this results in a decrease in the electric power generation. Particularly, in a thin-film solar cell panel in which thin-rectangular cells are connected in series and integrated, if a decrease in electric power generation is concentrated on some of the cells, these cells with decreased electric power become resistance for the entire panel, thus having an influence on an output decrease in the entire solar cell panel. Therefore, a substrate cleaning process is provided in manufacturing processes to remove the foreign substances. On the other hand, from a general viewpoint, an inspection of electric power generation on a solar cell panel in the manufacturing processes is performed, after confirming that visually checkable foreign substances of more than several tens of μm to 100 μm in size are removed such that the foreign substances do not become concentrated on a light incidence surface of the solar cell panel. In this case, small foreign substances of less than 100 μm in size are disregarded because they are considered to exert no influence.

In conjunction with the substrate cleaning, for example, Japanese Patent JP-P3057599B2 (corresponding to U.S. Pat. No. 5,894,853A) discloses one of techniques for substrate cleaning. JP-P3057599B2 discloses a cleaning apparatus including: a plurality of cleaning stages, reserving parts reserving cleaning fluids respectively used in the stages, and a passage mixing together the cleaning fluid reserved in the reserving part for one of the cleaning stages and the cleaning fluid reserved in the reserving part for the subsequent cleaning stage to supply the mixture to one of the cleaning stages.

In manufacturing solar cell panels as described above, an inspection of electric power generation is performed for quality control while the solar cell panels are manufactured or after the solar cell panels are completed. This inspection of the electric power generation is performed by measuring characteristics of electric power generation (current, voltage, output, and the like) while generating electric power through irradiation of simulated sunlight to the solar cell panel by a solar simulator.

Here, when the inspection of the electric power generation after the completion of solar cell panels is performed, results of the inspection vary and outputs of the solar cell panels decrease in some cases, although these solar cell panels are manufactured under identical conditions. The large variation in the results and the output decrease in the solar cell panels cause a reduction in a manufacturing yield of the solar cell panels. One of possible factors contributing to such variation in the results and such output decrease is influence of foreign substances adhering to a light incidence surface of the solar cell panel. However, even after a cleaning method is devised by a conventional method, the variation in the inspection results and the output decrease in the solar cell panels still remain.

That is, it is desired to provide a technique capable of performing an inspection of electric power generation with even higher accuracy without a variation in results and the output decrease in the solar cell panels under identical condition.

The inventors have now discovered the following fact. Various investigation tests performed by the inventors clarified that adhesion of fine foreign substances and dirt on the light incidence surface, which has not received any attention so far and has been hardly visually checked, has an influence on the inspection of the electric power generation performed with a solar simulator.

Generally, the solar cell panel is installed outdoors for use in electric power generation. In this case, under the outdoor sunlight, not only direct light but also scattering light enters the solar cell panel. Thus, even though adhesion of such small foreign substances and dirt, which are not visually checkable, blocks the light incidence on the solar cell panel, this little influences a performance of the electric power generation, thus resulting in no problem.

However, in particular, influence on accuracy of evaluation performed by an inspection device of electric power generation in a manufacturing process of the solar cell panel has been clarified.

SUMMARY OF THE INVENTION

Therefore, an object of the present invention is to provide a method of manufacturing a solar cell panel capable of performing measurement with a high accuracy without a variation in results and an output decrease under identical condition.

This and other objects, features and advantages of the present invention will be readily ascertained by referring to the following description and drawings.

In order to achieve an aspect of the present invention, the present invention provides a method of manufacturing a solar cell panel, including: (a) forming a solar cell module by laminating solar cell films on a transparency substrate; (b) performing an inspection of electric power generation on the solar cell module; (c) forming a solar cell panel by executing a panel formation on the solar cell module; (d) cleaning a light incidence surface of the solar cell panel; and (e) performing an inspection of electric power generation on the solar cell panel. The step (d) is executed immediately before the step (e).

In the method of manufacturing a solar cell panel, the direct light may be used as a light source in the steps (b) and (e).

In the method of manufacturing a solar cell panel, the step (d) may include: (d1) cleaning the light incidence surface such that foreign substances, each of which has a size of 0.1 µm to 100 µm, are removed.

In the method of manufacturing a solar cell panel, the step (a) may include: (a1) laser-etching at least one of the solar cell films. The step (b) may be executed after the step (a1) is finished. The step (c) may include: (c1) fitting a terminal box on a backside of the solar cell module.

In the method of manufacturing a solar cell panel, the step (d) may include: (d2) cleaning the light incidence surface by using organic solvent.

In the method of manufacturing a solar cell panel, the step (d) may include: (d3) cleaning the light incidence surface by using ultrasonic cleaning.

In the method of manufacturing a solar cell panel, the step (d) may include: (d4) cleaning the light incidence surface by using pressured water shower cleaning.

BRIEF DESCRIPTION OF THE DRAWINGS

FIG. 2 is a flowchart showing a method of manufacturing a solar cell panel according to the present invention;

FIGS. 3A and 3B are views showing manufacturing processes of the method of manufacturing the solar cell panel according to the present invention;

FIG. 6 is a table showing results of the embodiments 1 to 3 and the comparative examples 1 and 2.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
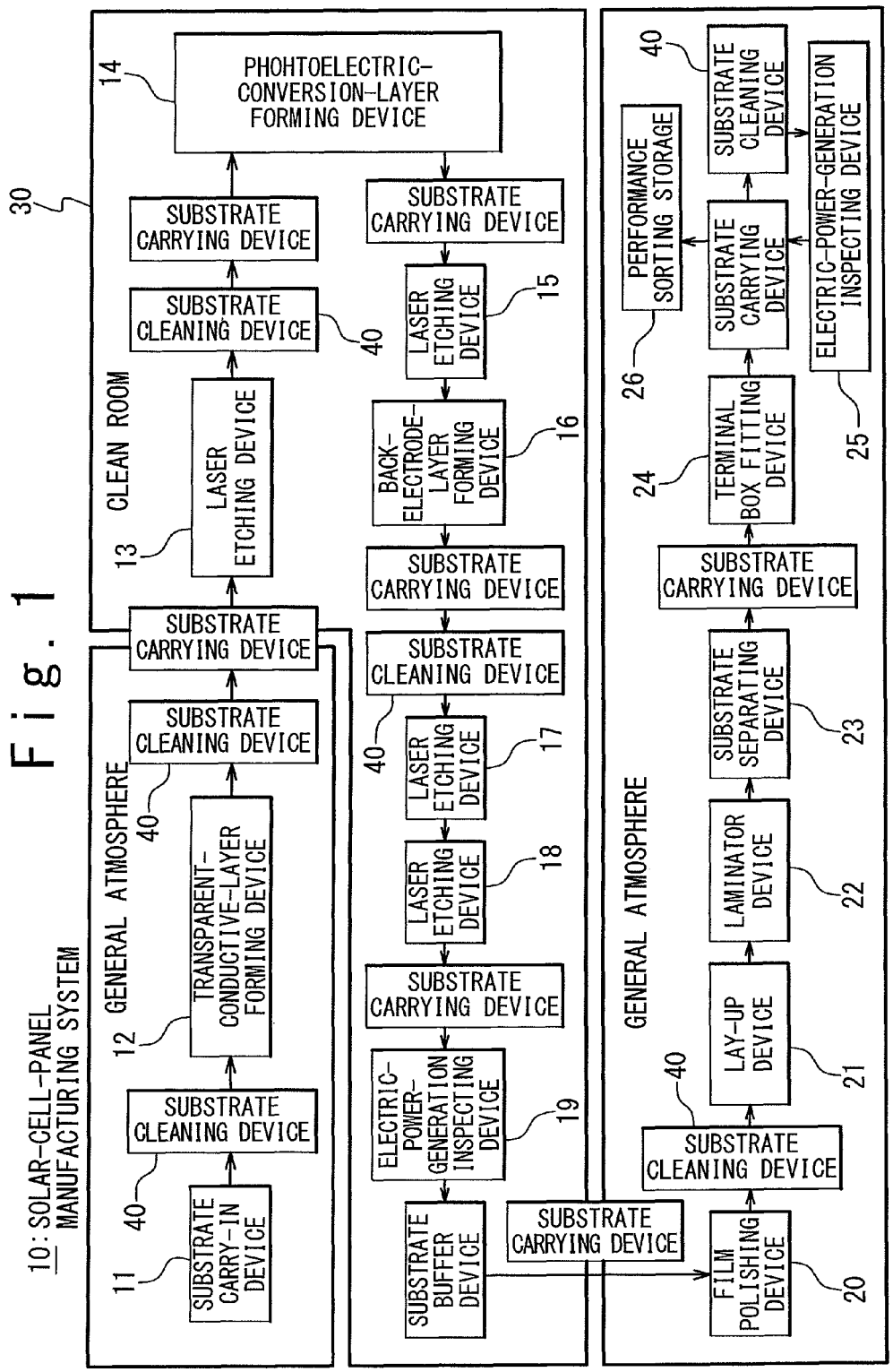
FIG. 1 is a diagram showing a configuration of a solar-cell-panel manufacturing system 10 according to the present invention.

The embodiment according to the present invention will be described referring to the accompanying drawings. FIG. 1 is a schematic diagram showing layout of a solar-cell-panel manufacturing system 10 for executing a method of manufacturing a solar cell panel according to the present invention. The solar-cell-panel manufacturing system 10 includes: a substrate carry-in device 11, a transparent-conductive-layer forming device 12; a laser etching device 13 for laser-etching a transparent conductive layer; a photoelectric-conversion-layer forming device 14; a laser etching device 15 for laser-etching a photoelectric conversion layer; a back-electrode-layer forming device 16; a laser etching device 17 for laser-etching a back electrode layer; a laser etching device 18 for forming insulating grooves; an electric-power-generation inspecting device 19 for performing an inspection of electric power generation on the solar cell module; a film polishing device 20; a lay-up device 21; a laminator device 22; a substrate separating device 23; a terminal box fitting device 24; an electric-power-generation inspecting device 25 for performing an inspection of electric power generation on the solar cell panel; and a performance sorting storage 26. A transparency substrate 1 carried in the solar-cell-panel manufacturing system 10 by the substrate carry-in device 11 is processed by the respective devices in the order just mentioned above, whereby the solar cell panel is manufactured. Substrate carrying devices such as a carrying roller and the like (not shown) are provided between any two of the above-mentioned devices. The substrate is carried from an upstream side to a downstream side by the substrate carrying devices.

At each downstream side of the substrate carry-in device 11, the transparent-conductive-layer forming device 12, the laser etching device 13, the back-electrode-layer forming device 16, and the film polishing device 20, and terminal box fitting device 24, a substrate cleaning device 40 is arranged. These substrate cleaning devices 40 are shower cleaning devices using pressured water. Some of the substrate cleaning devices may first perform roll brush cleaning for facilitating a removal of foreign substances. These substrate cleaning devices are arranged for the purpose of removing, through the shower cleaning with pressured water, foreign substances adhering to the solar cell panel substrate under manufacturing during processing or carrying by the devices.

The solar-cell-panel manufacturing system 10 is separated into an inside and an outside of a clean room 30. The laser etching device 13, the photoelectric-conversion-layer forming device 14, the laser etching device 15, the back-electrode-layer forming device 16, the laser etching devices 17 and 18, and the electric-power-generation inspecting device 19 are arranged inside the clean room 30. The other devices are arranged outside the clean room 30.

The laser etching device 13 to the electric-power-generation inspecting device 19 are arranged inside the clean room 30. It is because foreign substances can be prevented from adhering on the incidence surface of the solar cell module substrate under manufacturing, before and after processes of film-forming the photoelectric conversion layer and the back electrode layer. This can makes a deterioration and a fluctuation of inspection characteristics of electric power generation, which are caused by the adhesion of foreign substances, suppressed.

The substrate carry-in device 11 to the transparent-conductive-layer forming device 12 are arranged outside the clean room 30, because the foreign substances are often found on the substrate exiting from the transparent-conductive-layer forming device 12. This can make a decrease of the cleanliness of the clean room suppressed. The reason why there is a large amount of foreign substances on the substrate carried out of the transparent-conductive-layer forming device 12 is that a thermal CVD apparatus is typically used as the transparent-conductive-layer forming device 12. When the thermal CVD device is used, the substrate is likely to be carried out of the transparent-conductive-layer forming device 12 while particles growing in a gas phase are placed on the substrate.

The reason why the film polishing device 20 and the devices thereafter outside the clean room is, as is the case with the transparent-conductive-layer forming device 12, that this can avoid a deterioration of the cleanliness of the clean room caused by polishing dusts or abrasive grains generated at the time of film-polishing.

Next, a method of manufacturing a solar cell panel of the present embodiment will be described below. FIG. 2 is a flowchart showing the method of manufacturing a solar cell panel. The method of manufacturing a solar cell panel includes: a process of forming a solar cell module (step S10); a process of performing an inspection of electric power generation on the solar cell module (step S20); a process of forming a panel using the solar cell module, while performing lamination processing of the solar cell module with a cover sheet or the like, up to terminal box connection (step S30); a process of cleaning the solar cell panel (step S40); and a process of performing an inspection of electric power generation on the solar cell panel (step S50).

In the solar-cell-panel manufacturing system 10 shown in FIG. 1, the solar cell module is formed by the devices from the substrate carry-in device 11 to the laser etching device 18 (step S10). The inspection of the electric power generation is executed by the electric-power-generation inspecting device 19 (step S20). This permits an intermediate inspection to be performed at a stage where the module has been completed in order to check manufacturing quality in the module manufacturing processes. The panel formation (fabrication) is executed by the devices from the film polishing device 20 to the terminal box fitting device 24 (step S30). The cleaning is executed on the substrate of the solar cell panel to which the processing executed by the terminal box fitting device 24 has been finished (step S40). After that, the inspection of the electric power generation on the solar cell panel is executed by the electric-power-generation inspecting device 25 (step S50).

Figure 3B:
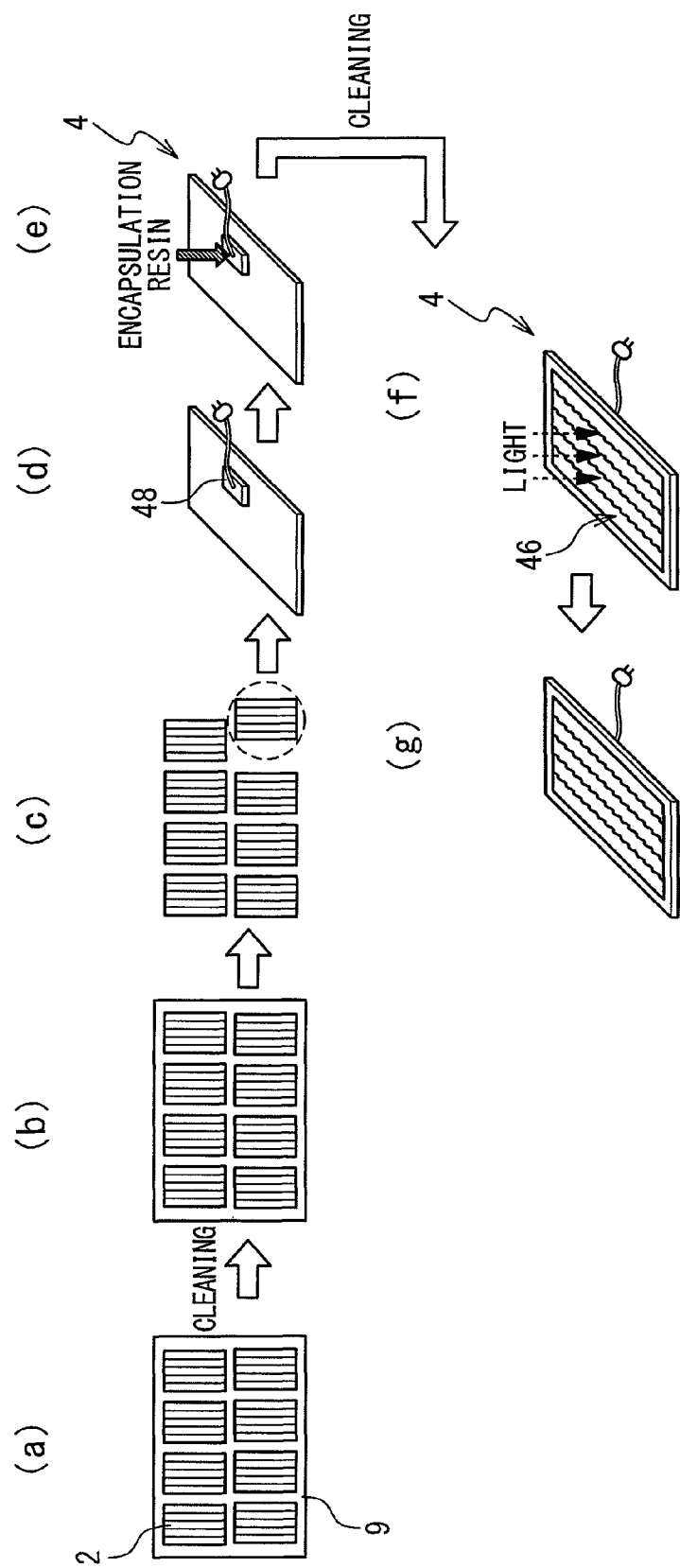

FIGS. 3A and 3B are views showing the manufacturing processes of the method of manufacturing the solar cell panel of the present invention. The processes performed in the steps S10 to S50 will be described with reference to FIGS. 2, 3A and 3B. Here, the description refers to a case where a single-layer amorphous silicon thin-film solar cell is used as an electric power generating cell 6 on the transparency substrate 1. As the electric power generating cell 6, not only the single-layer amorphous silicon solar cell but also all types of thin-film solar cell family, such as microcrystalline silicon solar cell, polycrystalline silicon solar cell, silicon germanium solar cell, and a tandem-stacked solar cell, which integrally connect together the different cells, provide the same effect.

(1) Step 10: Formation of Solar Cell Module

As shown in FIG. 3A (a), a soda float glass substrate (1.4 m×1.1 m×4 mm$^t$ in thickness) is prepared as the transparency substrate 1. The substrate end face is preferably corner-chamfered or round-chamfered for breakage prevention. The transparency substrate 1 is carried into the solar-cell-panel manufacturing system 10 by the substrate carry-in device 11. The transparency substrate 1 carried into the solar-cell-panel manufacturing system 10 is cleaned by the substrate cleaning device 40.

As shown in FIG. 3A (b), as a transparent conductive layer 5, a transparent conductive film of approximately 500 to 800 nm, mainly including a tin oxide film ($SnO_2$) is formed at approximately 500° C. by using a thermal CVD device (the transparent-conductive-layer forming device 12). In this process, an adequately unleveled texture is formed on a surface of the transparent conductive film. As the transparent conductive layer 5, in addition to the transparent conductive film, an alkali barrier film (not shown) may be formed between the transparency substrate 1 and the transparent conductive film. The alkali barrier film of 50 to 150 nm, mainly including an oxide silicon film ($SiO_2$), can be formed at approximately 500° C. by using the thermal CVD device.

The substrate under manufacturing solar cell module (hereinafter, a substrate under manufacturing solar cell module or a substrate under manufacturing solar cell panel may be referred to as a substrate under manufacturing), to which the processing performed by the transparent-conductive-layer forming device 12 has been finished, is cleaned to remove the adhering foreign substances by the substrate cleaning device 40.

Subsequently, the substrate under manufacturing is set on an X-Y table. As shown in FIG. 3A (c) a first higher harmonic (1064 nm) of a YAG laser (laser etching device 13) is made incident from a film surface side of the transparent conductive layer 5 as shown by an arrow in FIG. 3A (c). With a pulsed oscillation of 5 to 20 kHz, the laser power is adjusted so as to be suitable for a processing speed. The transparent conductive layer 5 is laser-etched to be a laser etching line (groove) 41 in a direction perpendicular to a direction in which the electric power generating cells 6 are connected in series such that thin rectangles (reed shape or strip shape) of approximately 6 to 10 mm in width are formed.

The substrate under manufacturing, to which the processing performed by the laser etching device 13 has been finished, is cleaned by the substrate cleaning device 40, thereby removing the foreign substances adhering to the substrate under manufacturing.

As shown in FIG. 3A (d), a p-layer film, an i-layer film, and an n-layer film all made of an amorphous silicon thin film are sequentially formed as a photoelectric conversion layer 7 by using a plasma CVD device (photoelectric-conversion-layer forming device 14) at a reduced pressure atmosphere of 30 to 150 Pa and approximately 200° C. The photoelectric conversion layer 7, mainly made of $SiH_4$ gas and $H_2$ gas, is formed on the transparent conductive layer 5. The p-layer, the i-layer, and the n-layer are laid in this order from a side where the sunlight enters. The photoelectric conversion layer 7 in the present embodiment may include: the p-layer of 10 to 30 nm in film thickness mainly including B-doped amorphous SiC; the i-layer of 250 to 350 nm in film thickness mainly including amorphous Si; and the n-layer of 30 to 50 nm in film thickness mainly including p-doped microcrystalline Si. Moreover, between the p-layer film and the i-layer film, a buffer layer may be provided for the purpose of improving interface characteristics.

Subsequently, the substrate under manufacturing is placed on the X-Y table. As shown in FIG. 3A (e), a second higher harmonic (532 nm) of a laser diode pumped YAG laser (laser etching device 15) is made incident from a film surface side of the photoelectric conversion layer 7 as shown by an arrow in FIG. 3A (e). With a pulsed oscillation of 10 to 20 kHz, the laser power is adjusted so as to be suitable for a processing speed. A side of approximately 100 μm to 150 μm away from the laser etching line 41 in the transparent conductive layer 5 is laser-etched to be a laser etching line (groove) 42.

As shown in FIG. 3A (f), as a back electrode layer 8, an Ag film and a Ti film are sequentially formed by a sputtering device (back-electrode-layer forming device 16) at a reduced pressure atmosphere and approximately 150° C. The back electrode layer 8 in the present embodiment includes: an Ag film of 200 to 500 nm in thickness, a highly anticorrosive Ti film of 10 to 20 nm in thickness for protecting the Ag film, which are stacked in this order. For the purpose of reducing a contact resistance between the n-layer and the back electrode layer 8 and also improving a light reflection, GZO (Ga-doped ZnO) film of 50 to 100 nm in film thickness may be provided between the photoelectric conversion layer 7 and the back electrode layer 8 through film-forming by a sputtering device.

The substrate under manufacturing, to which the processing performed by the back electrode layer forming device 13 has been finished, is cleaned to remove the adhering foreign substances by the substrate cleaning device.

Subsequently, the substrate under manufacturing is placed on the X-Y table. As shown in FIG. 3A (g), a second higher harmonic (532 nm) of a laser diode pumped YAG laser (laser etching device 17) is made incident from the transparency substrate 1 side as shown by an arrow in FIG. 3A (g), whereby the laser light is absorbed at the photoelectric conversion layer 7. Due to a high gas vapor pressure generated at this point of the photoelectric conversion layer 7, the back electrode layer 8 explodes and thus is removed. With a pulsed oscillation of 1 to 10 kHz, the laser power is adjusted so as to be suitable for the processing speed. A side of approximately 250 μm to 400 μm away from the laser etching line 41 in the transparent conductive layer 5 is laser-etched to be a laser etching line (groove) 43.

As shown in FIG. 3A (h), an end portion of the films near the substrate end is separated from a power generation region to eliminate tendency that series-connected portions formed by the laser etching process is easy to be short-circuit. The substrate under manufacturing is placed on the X-Y table. Then, a second higher harmonic (532 nm) of a laser diode pumped YAG laser (laser etching device 18) is made incident from the transparency substrate 1 side, whereby the laser light is absorbed at the transparent conductive layer 5 and the photoelectric conversion layer 7. Due to the high gas vapor pressure generated at this point of the transparent conductive layer 5 and the photoelectric conversion layer 7, the back electrode layer 8 explodes and thus is removed. With a pulsed oscillation of 1 to 10 kHz, the laser power is adjusted so as to be suitable for a processing speed. Along each of two opposite sides of four sides in the substrate, the area at position 5 to 15 mm from the substrate end is laser-etched to thereby form an insulating groove 44. At this point, no insulating groove is provided on the other two opposite sides. The laser-etching for the insulating groove 44 is ended at the position 5 to 10 mm from the substrate end. The end of the laser-etching may be an end of the laser light. Also, the end of the laser-etching may be achieved simply by installing a metallic masking plate on a non-laser etched region of the substrate. In this way, it is preferable that the end of the laser-etching at a position 5 to 10 mm from the substrate end in this manner makes external moisture less likely to enter from a solar cell panel end part into the solar cell module.

As described above, through the operations in FIG. 3A (a) to (h), the solar cell module 3 having a plurality of power generating cells 6 with thin rectangles (reed shape or strip shape) is formed on the transparency substrate 1.

(2) Step S20: Inspection of Electric Power Generation on Solar Cell Module

Subsequently, as shown in FIG. 3A (i), the inspection of the electric power generation on the solar cell module 3 is performed as an intermediate inspection in the solar cell manufacturing processes. The solar cell module 3 is irradiated with the direct light to a light incidence surface 46 by a source simulator of the electric-power-generation inspecting device 19. Through this light irradiation to the light incidence surface 46, the solar cell module 3 generates electric power. Characteristics of electric power generation (voltage with respect to a generated current, output characteristics, and the like) at this time are measured. Here, the solar cell modules 3, which have characteristics of electric power generation falling within specifications that a product is determined to be capable of supplying the output controlled for a final product, are carried to the next process. On the other hand, the solar cell modules 3, which have characteristics of electric power generation deviating from the specifications, are not carried to the next panel formation process, but processed as defective products or transported to recycle process. Moreover, performing the intermediate inspection of the electric power generation on the solar cell module permits monitoring and controlling the yield of the formation process of solar cell modules.

(3) Step S30: Formation of Solar Cell Panel

Subsequently, as shown in FIG. 3B (a), the film polishing device 20 removes a solar cell film 2 (including the transparent conductive layer 5, the photoelectric conversion layer 7, and the back electrode layer 8) in a region 9 which will be an outer periphery of a solar cell panel. This removal is intended to ensure appropriate bonding and sealing surface at the time of attaching a back sheet through EVA (ethylene vinyl acetate copolymer) or the like in the subsequent process. Here, the solar cell film 2 located on the substrate end side away from the insulating groove 44 provided in FIG. 3A (h) to the substrate end is polished and removed.

The substrate, to which the processing performed by the film polishing device 20 has been finished, is water-cleaned with pressured water using purified water by the substrate cleaning device 40, thereby removing polishing dusts and abrasive grains.

As shown in FIG. 3B (b), the lay-up device 21 loads the EVA sheet and the cover sheet on the substrate under manufacturing. Further, the laminator device 22 heats and bonds the cover sheet loaded on the substrate under manufacturing via the EVA sheet.

As shown in FIG. 3B (c), when necessary, the substrate separating device 23 segments the substrate under manufacturing in accordance with a size of the solar cell panel 4.

As shown in FIG. 3B (d), the terminal box fitting device 24 fits the terminal box 48 on a backside of the solar cell module 3. Further, as shown in FIG. 3B (e), an encapsulation resin is injected into the terminal box 48, thereby completing the solar cell panel 4.

(4) Step S40: Cleaning Solar Cell Panel

Subsequently, the light incidence surface of the solar cell panel 4 is cleaned. The present invention devises this cleaning process in step S40. Detailed operation performed in this step will be described later.

(5) Step S50: Inspection of Electric Power Generation on Solar Cell Panel

Subsequently, as shown in FIG. 3B (f), the electric-power-generation inspecting device 25 performs the inspection of the characteristics of the electric power generation of the solar cell panel 4. The inspection of the electric power generation is performed immediately after the solar cell panel is cleaned in step S40. That is, the cleaning in step S40 is performed immediately before the inspection of the electric power generation. The inspection in this step is the same as the inspection of the electric power generation on the solar cell module 3 (step S20). That is, through irradiation of the direct light to the light incidence surface 46 by the solar simulator, the inspection of the characteristics of the electric power generation is performed on the solar cell panel 4.

The characteristics of the electric power generation in step S50 are checked as output characteristics of a solar cell panel product, and also compared with the characteristics of the electric power generation obtained in step S20. As a result of comparison, monitoring and controlling whether a difference between a result of step S20 and a result of step S50 is within a predetermined range permits recognizing a yield of the panel formation process and thus determining a production processing status. Solar cell panel substrates with the characteristics of the power generation deviating from the predetermined range are handled as the defective products or, when necessary, as the products to be recycled. In this way, performing the inspection of the electric power generation in two stages (steps S20 and S50) permits eliminating the defective substrates under manufacturing in the middle of manufacturing processes. Also, it permits separately recognizing the yield of the module formation process and the yield of the panel formation process to improve a cause of defect found in the entire processing processes. This leads to an improvement of a through put and the yields.

The solar cell panel 4, to which the inspection of the electric power generation (step S50) has been finished, is carried to the performance sorting storage 26. The solar cell panel 4 is classified based on the characteristics of the electric power generation according to a predetermined criteria, and then is sorted in the performance sorting storage 26.

The solar cell panel 4 is manufactured through the processes in steps S10 to 50 described above. In such a method of manufacturing of a solar cell panel, the present embodiment devises execution of cleaning processing in step S40. The processing performed in step S40 will be described below.

The cleaning of the solar cell panel 4 is executed immediately before the inspection of the electric power generation (step S50). Methods of cleaning are exemplified in cleaning by a physical wiping, cleaning by an organic solvent, cleaning by a cleaning device with a pressured water shower; cleaning by an ultrasonic cleaning device; cleaning by a roll brush; and the like. In a case that an organic solvent (isopropyl alcohol or the like) is used, a light incidence surface of the solar cell panel 4 may be wiped with a nonwoven fabric soaked with the organic solvent. This permits removing dirt adhering to the light incidence surface. The nonwoven fabric is exemplified in Bemcot (product name: manufactured by ASAHI KASEI FIBERS CORPORATION) and the like. The use of the organic solvent is preferable since this can remove even dirt strongly adhesive to the substrate 1 of resin or the like. Moreover, a cleaning effect may be enhanced by a cleaning in appropriate combination of the cleaning by physical wiping, the cleaning by an organic solvent, the cleaning by the cleaning device with the pressured water shower, the cleaning by the ultrasonic cleaning device, and the cleaning by the roll brush.

Typically, the solar cell panel is installed outdoors for use as a product. The solar cell panel generates electric power by an incidence of the sunlight into the solar cell film through the light incidence surface. Here, as in the embodiment described above, when dirt (foreign substance) is present on the light incidence surface of the transparency substrate 1, this portion becomes shady. Hereinafter, the foreign substance is assumed to be a sphere particle, and its size is represented by a diameter. However, the shape of the foreign substance is not limited to the sphere, and may have other conventionally known shape whose size is represented by a longest length. In a shady portion, the amount of light incidence on the solar cell film decreases, thus deteriorating the characteristics of the electric power generation. Note that the size of foreign substance typically concerned here is a diameter substantially larger than 100 μm. The sunlight outdoors includes not only the direct light but also the scattering light. Therefore, even under the presence of foreign substances, if they are not a collection of the foreign substances and each of foreign substances has a diameter of substantially 100 μm or less, the light also turns around immediately below the foreign substances from the surrounding, thus the characteristics of the electric power generation are not considerably deteriorated. That is, the foreign substance of a diameter smaller than substantially 100 μm do not practically result in a significant problem.

In the manufacturing processes of the solar cell panel, the foreign substance of a diameter larger than substantially 100 μm, which may practically result in a problem, can be removed by, for example, performing water cleaning with the pressured purified water after exit from the film polishing device. This permits confirming the absence of residual foreign substances through visual observation or with an inspection device using a camera. In the processes after the film polishing device, adhesion of a foreign substance of a diameter larger than substantially 100 μm is less likely to occur. Therefore, it is conventionally assumed that if the water cleaning is performed with the pressured water after the processing with the film polishing device 20, the solar cell panel does not need to be cleaned in the subsequent processes except for particular requirement.

However, repeated studies by the inventors have proved that even a foreign substance of 100 μm or less in diameter possibly has an influence on the characteristics of the electric power generation at the inspection of the electric power generation in the manufacturing processes of the solar cell panel, because of the following reasons.

The inspection of the electric power generation is usually performed by the solar simulator. Light emitted from the solar simulator mainly includes the direct light with little scattering light. Unlike the scattering light, when the direct light is radiated to the solar cell panel, a considerably small amount of the light turns around immediately below the foreign substances. Therefore, even the foreign substance of 100 μm or less in diameter possibly disturbs a light incidence onto the solar cell film.

As already described, the film polishing device 20 and devices thereafter are arranged outside the clean room. Therefore, the foreign substance of 100 μm or less in diameter may adhere to the light incidence surface of the solar cell panel due to transferring and adhering from the carrying roller, drop of ambient suspended materials onto the substrate 1, or the like. In addition, the shower water cleaning with the pressured water may fail to completely remove foreign substances of 100 μm or less in diameter.

Actually, when the inventors observed condition of the light incidence surface, to which the cleaning processing (step S40) was not performed, by the SEM (Scanning Electron Microscope), it was confirmed that foreign substances of approximately 0.1 μm to 100 μm in diameters adhered to the light incidence surface. In addition, within this range, many of the foreign substances on the light incidence surface had diameters of approximately 1 μm to 10 μm with an average particle diameter of 3 μm, and particles of 2 μm or less in diameter accounted for approximately 50%. When the direct light is used, light (wavelength: 300 nm to 800 nm) contributing to solar power generation is absorbed, reflected, and scattered by foreign substances of approximately 0.1 μm to 100 μm in diameter. Therefore, it has been proven that the characteristics of the electric power generation in the inspection of the electric power generation (step S50) are influenced by such foreign substances of approximately 0.1 μm to 100 μm in diameter, thus leading to deterioration and variation in the results of the characteristics of the electric power generation. Particles of 10 μm or less in diameter in particular are usually hard to identify through the visual inspection and thus their effect on the characteristics of the electric power generation remained unrecognized. Thus, the cleaning process (step S40) was important.

Moreover, the inspection of the electric power generation (step S20) performed in a stage of the solar cell module is executed inside the clean room and there is no process in which the foreign substances are easy to adhere to the incidence light side of the substrate 1 inside the clean room, so that the amount of the adhering foreign substances of 100 μm or less in diameter is small. Therefore, when the yield of the formation process of the solar cell panel is determined based on a difference between the characteristics obtained by the inspection at the step S20 and the characteristics obtained by the inspection at the S50, a situation that foreign substances of a practically acceptable size (0.1 μm to 100 μm) adheres to the light incidence surface of the substrate 1 is more strongly attributed to the difference than ever. This proves that it is preferable to remove, at the inspection of the electric power generation (step S50), foreign substances of 0.1 μm to 100 μm in diameter, particularly foreign substances of 1 μm to 10 μm in diameter hardly visually checkable and adhering in a large amount.

In the present embodiment, the cleaning (step S40) is performed immediately before the inspection of the electric power generation (step S50), so that the light incidence surface at the inspection of the electric power generation (step S50) is cleaned free of foreign substances of 0.1 μm to 100 μm in diameter. At the inspection of the electric power generation (step S50), light is not blocked by the foreign substances on the light incidence surface, thus the inspection can be performed stably. Due to the influence of the foreign substances, deterioration and variation in the characteristics of the electric power generation provided as results of the inspection of the electric power generation (step S50) can be suppressed. Moreover, between the inspections of the electric power generation (steps S20 and S50), a difference in the characteristics of the electric power generation arising from a difference in the amount of the adhering foreign substances can be reduced, thus improving the yield of the panel formation process.

Figure 4:
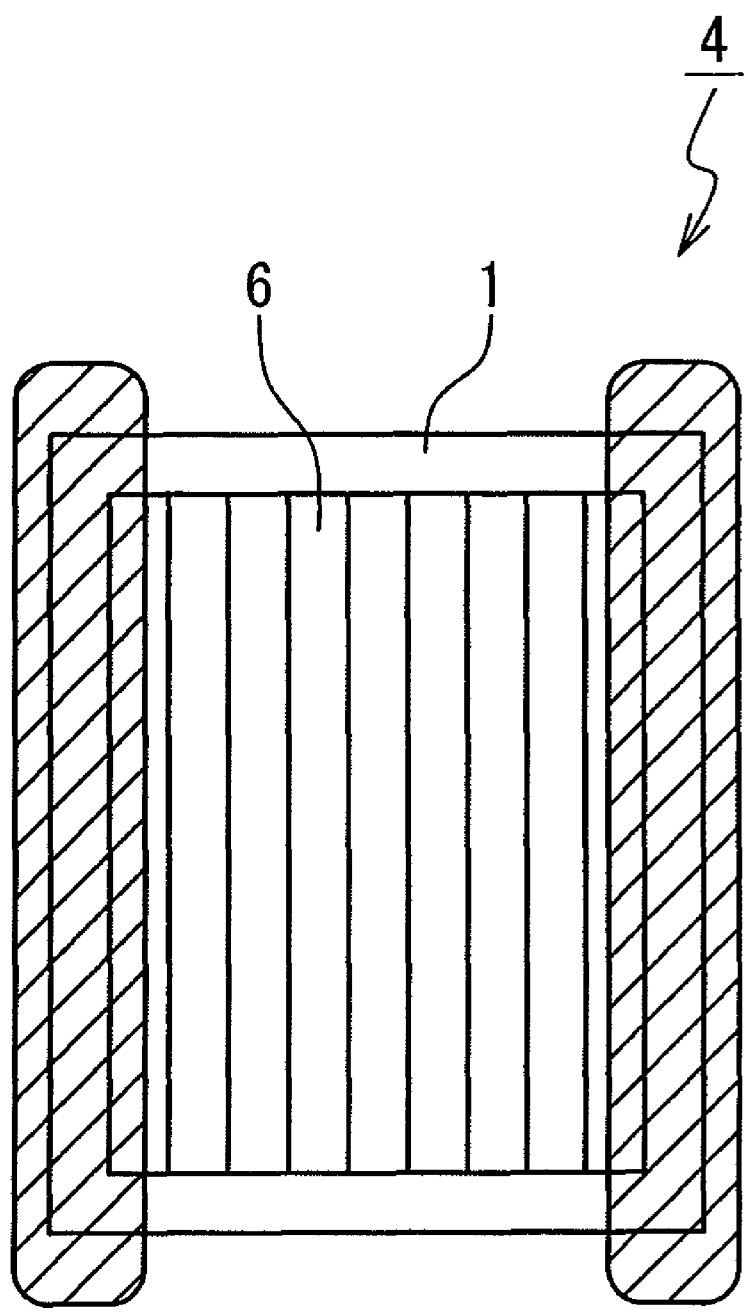
FIG. 4 is an explanatory diagram showing a region preferentially subjected to cleaning in step S40 in FIG. 2.

Subsequently, a region preferentially cleaned in the cleaning process (step S40) will be described below. FIG. 4 is a diagram of the solar cell panel 4 as viewed from the transparency substrate 1 side. Here, for a purpose of explaining a positional relationship, the solar cell film 2 is seen through the transparency substrate 1 in FIG. 4. Of the light incidence surface, regions with a high priority in the cleaning (step S40) is substrate peripheral portions. At the substrate peripheral portions, the solar cell film is removed by the film polishing device 20, upon which polishing dusts and abrasive grains often adhere to the light-incidence-side peripheral portion of the solar cell panel substrate. Thus, it is preferable to perform the cleaning (S40 step) of the substrate peripheral portion with the high priority. At this point, it is preferable to perform the cleaning so that the foreign substances do not remain in such a manner as to be located continuously, because a portion where the foreign substances remain in such a manner as to be located consecutively is likely to become resistance due to output drop.

It is more preferable that, of the peripheral portion, regions (regions with hatching in FIG. 4) parallel to a longer side direction of the electric power generating cell 6 divided into thin rectangles be given even higher priority. The study by the inventors has proved the following fact. When the cleaning process of step S40 is not provided, at the inspection of the electric power generation (step S50) compared to the inspection of the electric power generation (step S20), the open-circuit voltage (Voc) and short-circuit current (Isc) tend not to drop but the fill factor (FF) tends to drop. Such a behavior of the characteristics of the electric power generation indicates that performance deterioration occurs only in some of a plurality of the electric power generating cells 6. This leads to a conclusion that dirt remains continuously in the longitudinal direction of the electric power generating cells 6 and the amount of light incidence on these electric power generating cells 6 decrease, thus resulting in a decrease in the amount of electric power generation on some cells, so that these cells become resistances to the solar cell module. Therefore, it is preferable that, of the four sides of the substrate, regions along the sides parallel to the longer side direction of the electric power generating cell 6 be most preferentially cleaned. Here, the longer side direction denotes a longer side direction of the electric power generating cell 6 formed into thin rectangles in FIG. 4, and thus is not influenced by the length of each side of the solar cell panel substrate.

In the regions parallel to the shorter side direction of the electric power generating cell 6, a decrease in the amount of light incidence and output drop occurs in accordance with the area over which dirt adheres. However, this does not lead to the aforementioned condition that the entire longer sides of some of the electric power generating cells 6 become resistance. Therefore, this region does not have to be given such high priority as that placed on the regions parallel to the longer side direction.

Figure 5:
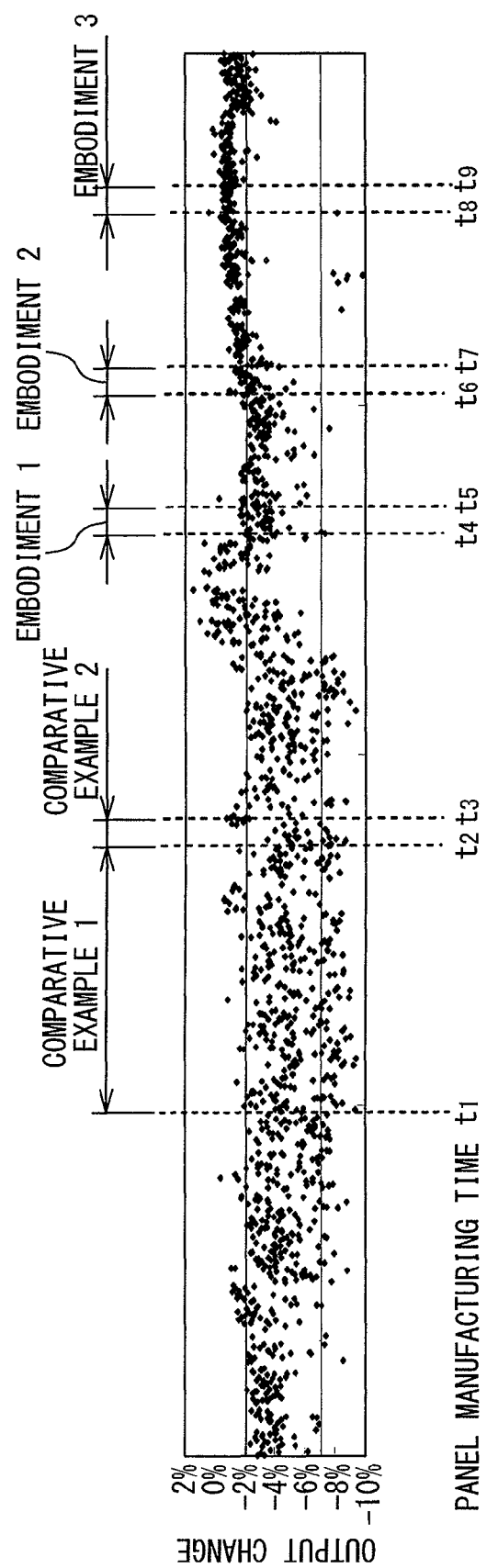
FIG. 5 is a graph showing results of embodiments 1 to 3 and comparative examples 1 and 2.

Hereinafter, referring to FIG. 5, comparison is made between cases where the cleaning (step S40) is performed immediately before the inspection of the electric power generation (step S50) and cases where the cleaning is not performed (comparative examples). FIG. 5 is a graph showing results of comparison between cases where the cleaning (step S40) is performed and cases where the cleaning is not performed. In FIG. 5, a vertical axis denotes an output change ((output in step S50−output in step S20)/output in step S20) (%). A horizontal axis denotes times when the inspections is performed by the electric-power-generation inspecting device 25 on the solar cell panel manufactured by the solar-cell-panel manufacturing system 10. With different conditions for the cleaning processing (step S40) provided for different times, comparative examples 1 and 2 and embodiments 1 to 3 are provided. The conditions at the cleaning (step S40) for the comparative examples 1 and 2 and the embodiments 1 to 3 are given below.

Comparative Example 1

The comparative examples 1 refer to solar cell panel substrates subjected to the inspection of the electric power generation (step S50) between times t1 and t2. For the solar cell panel substrate of the comparative example 1, the cleaning processing (step S40) is not performed.

Comparative Example 2

The comparative examples 2 refer to solar cell panel substrates subjected to the inspection of the electric power generation (step S50) between times t2 and t3. For the solar cell panel substrate of the comparative example 2, cleaning in the cleaning processing performed before the inspection of the electric power generation on the solar cell module (step S20) is enhanced. Specifically, for the pressured water showering and roll brush washing performed between the back-electrode-layer forming device 16 and the laser etching device 17, a distance between the roll brush and the solar cell panel substrate is reduced by a small amount to thereby increase the roll brush pushing pressure. For embodiments 1 to 3, cleaning between the back-electrode-layer forming device 16 and the back surface laser etching device 17 is performed by similarly increasing the roll brush pushing pressure.

Embodiment 1

The embodiments 1 refer to solar cell panel substrates subjected to the inspection of the electric power generation (step S50) between times t4 and t5. For the solar cell panel substrate of the embodiment 1, cleaning of physically wiping the light incidence surface (step S40) is performed immediately before the inspection of the electric power generation (step S50). The cleaning (step S40) is achieved by installing nonwoven fabric in a carrying line and then wiping the light incidence surface while pushing the nonwoven fabric against the light incidence surface. Bemcot (product name: manufactured by ASAHI KASEI FIBERS CORPORATION) is used as the nonwoven fabric.

Embodiment 2

The embodiments 2 refer to solar cell panel substrates subjected to the inspection of the electric power generation (step S50) between times t6 and t7. For the solar cell panel substrate of the embodiment 2, cleaning the light incidence surface with the organic solvent (step S40) is performed immediately before the inspection of the electric power generation (step S50). The cleaning (step S40) is achieved by wiping the light incidence surface with nonwoven fabric previously soaked with the organic solvent.

Embodiment 3

The embodiments 3 refer to solar cell panel substrates subjected to the inspection of the electric power generation (step S50) between times t8 and t9. For the solar cell panel substrate of the embodiment 3, as is the case with the embodiment 2, wiping is performed with the nonwoven fabric soaked with the organic solvent, and further, as is the case with the embodiment 1, cleaning by wiping the light incidence surface with the nonwoven fabric while physically pushing the nonwoven fabric thereagainst.

Experimental Results

FIG. 6 is a diagram showing results of the comparative examples 1 and 2 and the embodiments 1 to 3, which summarizes the results of FIG. 5. The (average) output change between the inspections of the electric power generation (between steps S50 and S20) was −4.7% for the comparative example 1 and −5.1% for the comparative example 2, while this output change was −3.3% for the embodiment 1, −2.5% for the embodiment 2, and −0.8% for the embodiment 3. That is, it was found that effect of enhancing the cleaning processing in the module formation process in the comparative example 2 is low as compared with the comparative example 1. Also, it was found that an output change was improved by cleaning the light incidence surface of the substrate 1 after an end of the module formation process in embodiments 1 to 3 as compared with the comparative example 1.

Moreover, dispersion obtained by statistically processing the results was 2.4% for the comparative example 1 and 2.0% for the comparative example 2, while this dispersion was 1.2% for the embodiment 1, 0.9% for the embodiment 2 and 0.3% for the embodiment 3. That is, it was proved that a variation in the output change was reduced for the embodiments 1 to 3 compared to the comparative examples 1 and 2.

It is indicated that, as in the embodiment 3 from among the embodiments 1 to 3, wiping the light incidence surface with the nonwoven fabric while pushing the nonwoven fabric thereagainst as the cleaning (step S40) immediately before the inspection of the electric power generation (step S50) permits reducing the output change and the dispersion more and permits inspecting the characteristics of the electric power generation of the solar cell panel with even higher accuracy.

According to the present invention, a method of manufacturing a solar cell panel can be provided which is capable of performing measurement with a high accuracy at an electric power generation inspection in manufacturing processes.

It is apparent that the present invention is not limited to the above embodiment, but may be modified and changed without departing from the scope and spirit of the invention.

What is claimed is:

1. A method of manufacturing a solar cell panel, comprising the steps of:
    (a) forming a solar cell module by laminating solar cell films on a transparency substrate, wherein the forming a solar cell module further comprises forming the solar cell films into a plurality of thin-rectangular electric power generating cells, and connecting in series and integrating the electric power generating cells;
    (b) performing an inspection of electric power generation on said solar cell module with a direct light;
    (c) forming a solar cell panel by executing a panel formation, wherein the forming a solar cell panel further comprises cleaning the transparency substrate after polishing and removing the solar cell films at a peripheral portion of the solar cell module;
    (d) performing an inspection of electric power generation on said solar cell panel with a direct light; and
    (e) cleaning a light incidence surface of the solar cell panel, immediately before the step (d) and after cleaning the transparency substrate in the step (c), such that foreign substances each having a size of not less than 0.1 µm and not more than 100 µm are removed, and
    wherein a difference in output characteristics between the step (b) and the step (d) is evaluated, so that when the difference in output characteristics is within a predetermined value, the solar cell panel is determined as a non-defective product.

2. The method of manufacturing a solar cell panel, according to claim 1, wherein the step (e) includes:
    (e1) cleaning a peripheral portion on the light incidence surface of the solar cell panel.

3. The method of manufacturing a solar cell panel, according to claim 1, wherein the step (e) includes:
    (e2) cleaning an area parallel to a longitudinal direction of the electric power generating cell at the peripheral portion on the light incidence surface of the solar cell panel.

4. The method of manufacturing a solar cell panel, according to claim 1, wherein the step (e2) includes:
    (e3) wiping the light incidence surface of the transparency substrate with a nonwoven fabric while pushing the nonwoven fabric thereagainst.

5. The method of manufacturing a solar cell panel, according to claim 1, wherein the step (e) includes:
    (e4) cleaning said light incidence surface of the transparency substrate by using organic solvent.

6. The method of manufacturing a solar cell panel, according to claim 2, wherein the step (e) includes:
    (e4) cleaning said light incidence surface by using organic solvent.

7. The method of manufacturing a solar cell panel, according to claim 2, wherein the step (e) includes:
    (e2) cleaning an area parallel to a longitudinal direction of the electric power generating cell at the peripheral portion on the light incidence surface of the solar cell panel.

8. The method of manufacturing a solar cell panel, according to claim 3, wherein the step (e) includes:
    (e4) cleaning said light incidence surface of the transparency substrate by using organic solvent.

* * * * *